United States Patent [19]

Pastoriza

[11] 3,803,590

[45] Apr. 9, 1974

[54] CONSTANT-CURRENT DIGITAL-TO-ANALOG CONVERTER

[75] Inventor: James J. Pastoriza, Lincoln, Mass.

[73] Assignee: Analog Devices, Inc., Norwood, Mass.

[22] Filed: Jan. 24, 1972

[21] Appl. No.: 220,016

Related U.S. Application Data

[62] Division of Ser. No. 809,700, March 24, 1969, Pat. No. 3,685,045.

[52] U.S. Cl. .......... 340/347 DA
[51] Int. Cl. .......... H03k 13/04
[58] Field of Search .......... 340/347

[56] References Cited

UNITED STATES PATENTS

| | | | |
|---|---|---|---|
| 3,611,353 | 10/1971 | Shipp | 340/347 DA |
| 3,281,832 | 10/1966 | Schwartz | 340/347 DA |
| 3,614,776 | 10/1971 | Eshleman | 340/347 DA |
| 3,573,795 | 4/1971 | Bowers, Jr. | 340/347 DA |
| 3,487,304 | 12/1969 | Kennedy | 340/347 DA X |
| 3,623,077 | 11/1971 | Clark | 340/347 DA |

OTHER PUBLICATIONS

Hoeschele, "Analog-to-Digital/Digital-to-Analog Conversion Techniques," 1968, pg. 168–178.

General Electric Transistor Manual, 7th Ed., 1964, pages 227–234.

*Primary Examiner*—Charles D. Miller
*Attorney, Agent, or Firm*—Bryan, Parmelee, Johnson & Bollinger

[57] ABSTRACT

A digital-to-analog converter the output circuit of which comprises a set of switching transistors arranged as current generators. The currents through the switching transistors are maintained constant by means of a supply voltage adjusting circuit comprising a separate reference transistor matched to one of the switching transistors and energized by the same voltage supply lines as the switching transistors. The supply voltage adjusting circuit includes an operational amplifier which senses the collector current of the reference transistor, and adjusts the supply voltage so as to maintain that collector current constant. This automatic adjustment of the supply voltage also maintains the current through the switching transistors constant.

14 Claims, 3 Drawing Figures

CONSTANT-CURRENT DIGITAL-TO-ANALOG CONVERTER

This application is a division of my copending application Ser. No. 809,700 filed Mar. 24, 1969, now U.S. Pat. No. 3,685,045.

This invention relates to digital-to-analog converters. More particularly, this invention relates to such converters which are capable of high-speed conversion with stability and freedom from transient effects.

A wide variety of digital-to-analog converters have been provided for many purposes heretofore. Initially such converters used vacuum tubes, but as with most electronic devices, vacuum tubes have been replaced with later developed solid-state elements. Since the design criteria of solid-state elements are significantly different from vacuum tubes, this replacement process has presented a number of special problems. In addition, with the increasing speeds attainable by computers and other digital devices, there has been a corresponding demand for increased speed from digital-to-analog converters.

Accordingly, it is a principal object of the present invention to provide solid-state digital-to-analog converters with improved operating characteristics, particularly high-speed conversion capabilities together with reliable, accurate performance.

Figure 1A:
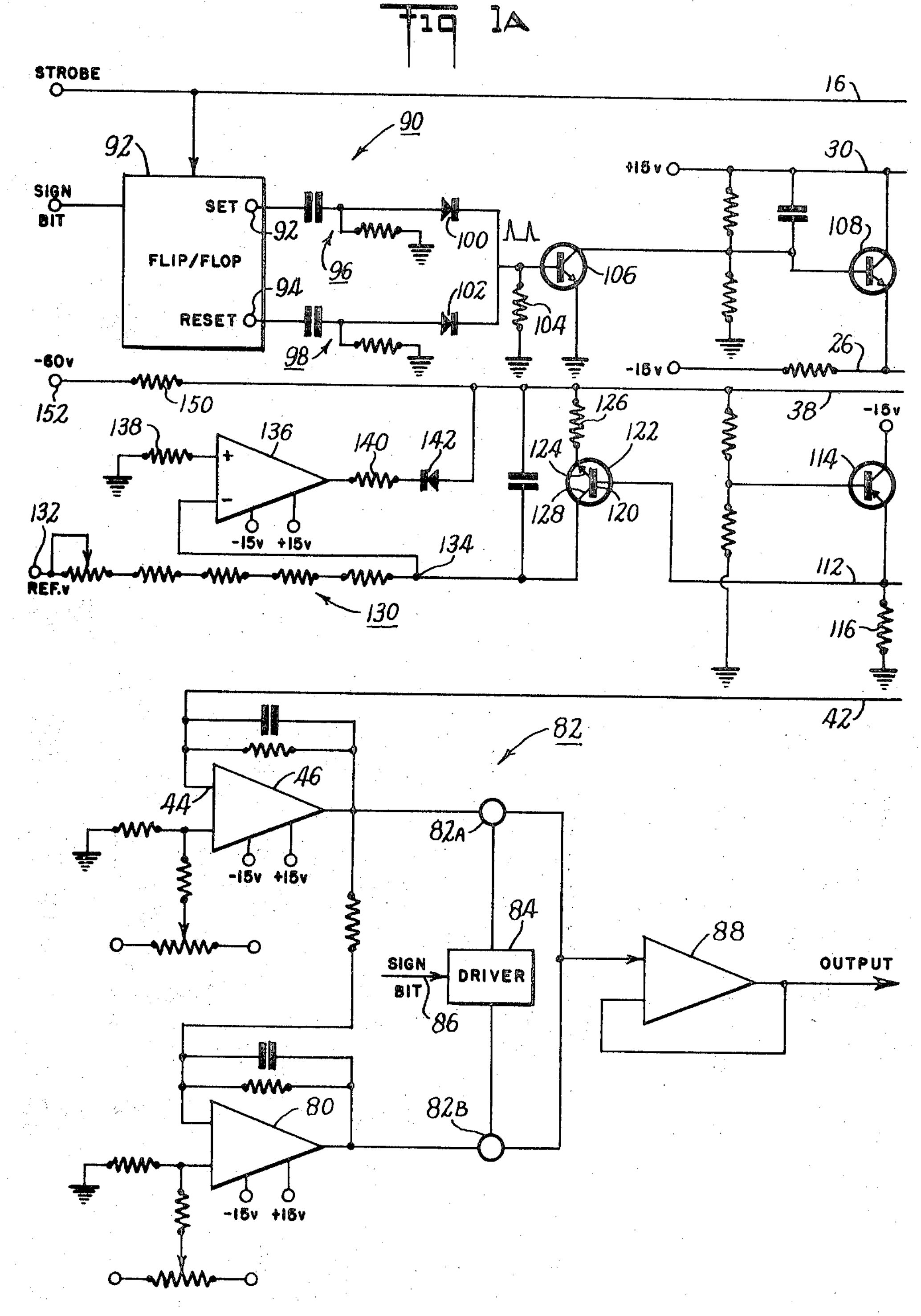
Figure 1B:
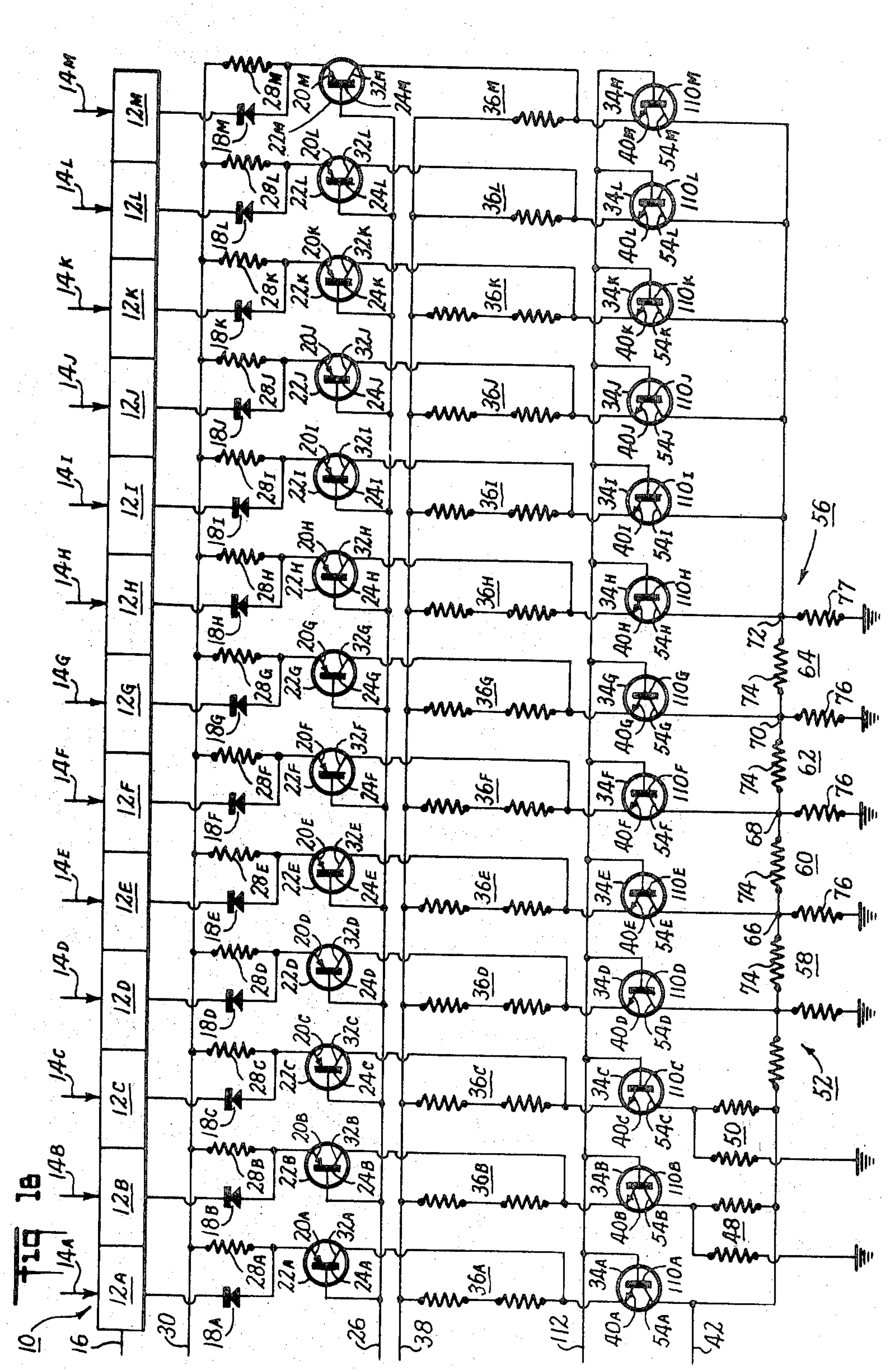
Figure 2:
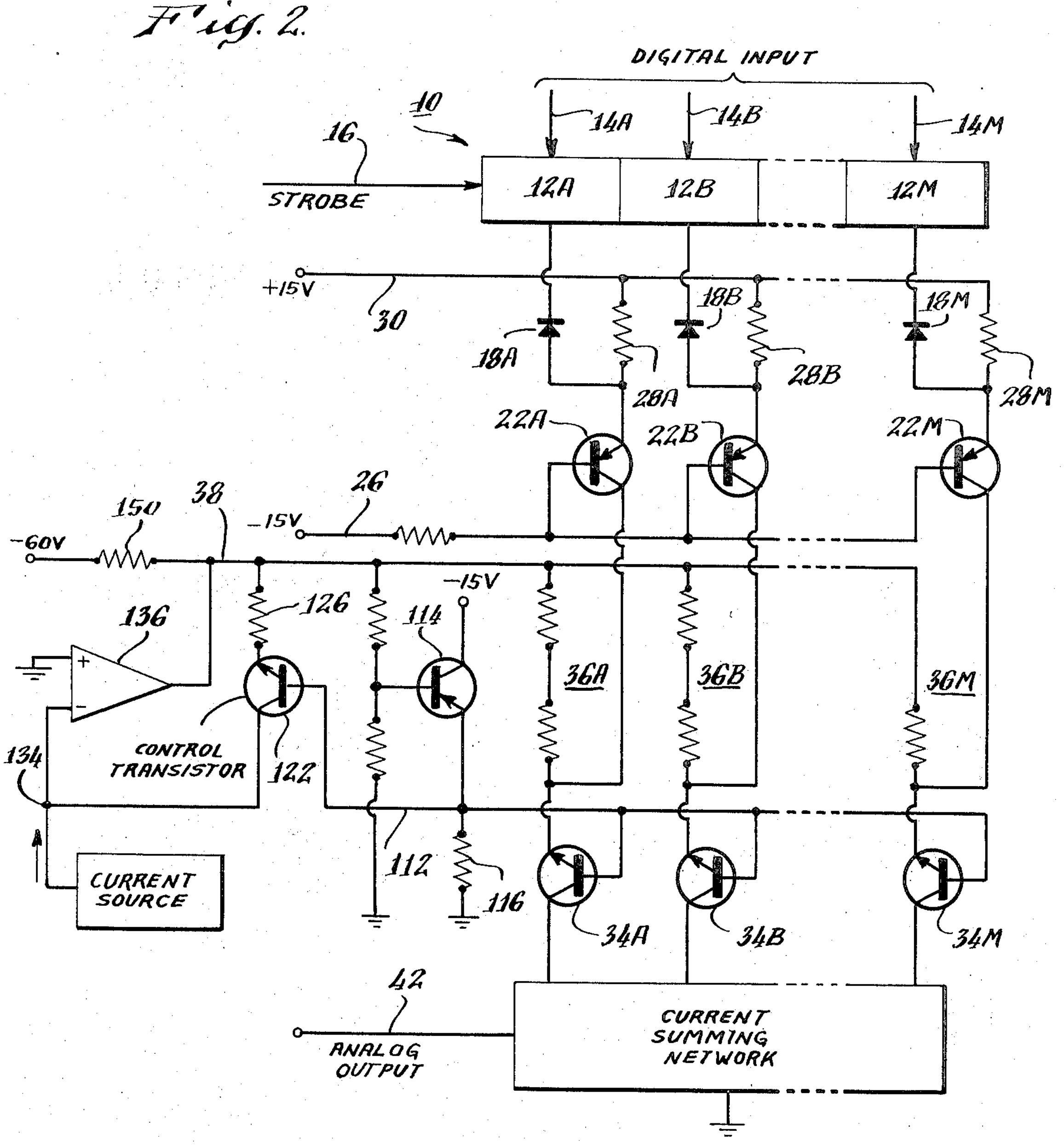

Other objects, aspects and advantages of the invention will in part be pointed out in, and in part apparent from, the following description considered together with the accompanying drawing in which FIGS. 1A and 1B together show a circuit diagram of one presently preferred embodiment of the invention, and FIG. 2 is a schematic diagram, partly in block, showing in simplified form the principal elements of the preferred embodiment which serve to maintain constant the current through the switching transistors.

Referring now to the upper portions of FIG. 1B, there is shown a conventional storage register 10 having a series of separate binary stages 12 (12A, etc.). Input leads 14 (14A, etc.) supply to the stages 12 the individual binary elements of a digital number to be converted to a corresponding analog signal level. These input leads may be connected to any digital source (not shown), such as a high-speed data processor.

The binary signals stored in the stages 12 are gated out essentially simultaneously by a strobe circuit 16 energized by conventional gate-generating means (not shown) producing periodic pulses of suitably high frequency. When the stages 12 are thus gated open, the stored binary signals are directed through respective coupling circuits comprising individual diodes 18 (18A, etc.). That is, each stage containing a stored binary bit produces a control pulse which passes through the corresponding coupling diode. This control pulse is of negative polarity, and is applied to the emitter 20 (20A, etc.) of a corresponding PNP buffer transistor 22 (22A, etc.) arranged so as normally to conduct current.

The bases 24 (24A, etc.) of all of the buffer transistors 22 are connected together to a power supply lead 26 providing a regulated bias voltage somewhat more positive than −15 volts. The emitters 20 of all of the buffer transistors are connected through respective resistors 28 (28A, etc.) to a second power supply lead 30 having a regulated voltage of about +15 volts. The collectors 32 (32A, etc.) of the buffer transistors are connected to corresponding NPN switching transistors 34 (34A, etc.) so as to control the output thereof in a manner to be described hereinbelow in detail.

The collector 32 of each buffer transistor 22 is connected to one end of a corresponding load resistor 36 (36A, etc.) forming part of the output circuit of the associated switching transistor 34. The remote ends of these load resistors are connected in common to a power supply lead 38 maintained at about −60 volts. When any buffer transistor is on, its output current flows through the associated load resistor 36, and the resulting voltage drop across this resistor causes the emitter 40 (40A, etc.) of the corresponding switching transistor to be biased to cut-off. Thus, no current will flow through a switching transistor while the associated buffer transistor is on.

When any buffer transistor 22 is cut off by a negative control pulse coupled through its input diode 18, the cut-off bias at the emitter 40 of the corresponding switching transistor 34 disappears, and that transistor therefore immediately conducts. The load circuit of each switching transistor is so arranged that when the transistor is turned on, the magnitude of its output current will be virtually equal to that of the current previously passing through the series resistor 36 from the associated buffer transistor 22. Thus, the operating conditions of the switching transistor will be changed but very little during the switching transition, e.g. the voltage of the emitter 40 may change by only a little more than 0.7 volts, the normal voltage drop across a conducting transistor. This small change in operating voltages tends to assure smooth and rapid switching.

The buffer transistors 22 serve the important function of substantially isolating the switching transistors 34 from the transient effects of the gating strobe control pulse. That is, such a control pulse, if applied directly to the switching transistor, would introduce relatively large momentary signal variations in the output circuit of the transistor, as a result, for example, of leakage capacitance coupling of the leading edge of the control pulse. Such transient effects introduce errors in the conversion operation, particularly as the conversion speed is increased to the point where there is insufficient time for the transient effects to settle out. The transient effects of a switching pulse are somewhat erratic, and are difficult to eliminate by conventional circuit arrangements.

The individual buffer transistors 22 significantly minimize the transient effects of capacitive coupling feedthrough to the switch output. The result is a considerable improvement in accuracy of the conversion, especially at high speeds. In addition, the use of the buffer transistors makes it readily possible to strobe the converter with negative-going gate pulses, preferred in such logic circuitry.

The output currents of all of the first eight switching transistors 34A–34H are pre-adjusted to be of exactly the same magnitude (approximately 1 mil), by selection of the appropriate value for the associated load resistors 36A–36H. A portion of the output current of each conducting transistor is coupled through a lead 42 to the summing input terminal 44 (FIG. 1A) of an operational amplifier 46. The magnitude of this portion of current is fixed in accordance with a 2:1 weighting relationship to correspond to the order of the binary bit represented by the respective switching transistor. Specifically, the current contribution of the second transistor 34B is arranged to be one-half that of the first transistor 34A, the current contribution of the third transistor 34C is one-half that of the second 34B, and so forth.

The output of the first switching transistor 34 is connected directly to the summing terminal 44 of the operational amplifier 46, and thus this transistor contributes its entire output. The next three switching transistors 34B, 34C, and 34D are connected to the summing terminal by individual weighting networks comprising current dividers 48, 50 and 52. The preferred form of divider consists of two series-connected resistors the common junction of which is connected to the collector electrode 54 of the associated switching transistor, and the remote terminals of which are connected respectively to ground and the summing input terminal 44 of the operational amplifier 46. Thus, the amount of current contributed by any one of these latter three switching transistors 34B, 34C and 34D is determined by the ratio of the two resistors in the corresponding current-divider network 48, 50 or 52, in such a manner as to provide the required 2:1 ratio from one to the next.

The next four output transistors 34E–34H form a second discrete set, all coupled to the summing input terminal 44 of the operational amplifier 46 by means of a two-to-one ladder network 56 consisting of a series of four cascaded identical stages 58, 60, 62 and 64. The intersection points 66, 68, 70 between the separate stages are connected respectively to the transistor collector electrodes 54E, 54F and 54G, and the right-hand end terminal 72 (serving as the input terminal for the ladder network) is connected to collector electrode 54H. In this ladder network, the ohmic resistance of each series resistance 74 is one-half that of the associated shunt resistance 76. Thus, visualizing the signal flow as proceeding from right to left, each stage of the ladder network provides a 2:1 attenuation of any current supplied thereto, either from the associated switching transistor 34, or from the preceding (right-hand) stage of the ladder network.

Although this ladder network 50 does introduce some distributed capacitance effects, and permits some interaction between the functioning of the associated switching transistors 34, these effects produce relatively small consequences in the overall conversion accuracy because the bits of data involved are several orders down from the most significant bit of the complete digital number. Moreover, such adverse effects are compensated for, at least to some extent, by arranging the switching transistors to produce the same magnitude of current output. This equal-current arrangement tends to minimize instability and other error effects.

The load resistors 36I–36M of the last set of five switching transistors 34I–34M are so proportioned relative to one another as to provide the desired two-to-one ratio in current flow through the respective transistors. The load resistors 28I–28M of the corresponding buffer transistors 22I–22M are similarly proportioned. That is, each resistor in the sequence has a total ohmic resistance of approximately twice that of the preceding resistor of the sequence. Thus, the magnitude of the current supplied by each switching transistor 34I–34M is one-half that of the preceding transistor, i.e. the transistor to the left, as seen in the drawing.

The collector electrodes (54I–54M) of all five of this third set of switching transistors 34I–34M are connected together to the input terminal 72 of the ladder network 56. Any one of the transistors which is gated on will thus supply a corresponding weighted current contribution through the ladder network to the summing input terminal 44 of the amplifier 46. Although the use of currents of different magnitude in each of the switching transistors 34I–34M introduces some asymmetries in the conversion operation, these asymmetries do not have any important effect on the final result because the five transistors of this third set provide digital bits corresponding to the lowest orders of the digital number, i.e. the five least significant bits of the group. The direct connection of this third set provides desirable economies of construction without important performance limitations.

For some applications, it is necessary to provide a sign-change capability, i.e. so as to develop either positive or negative analog outputs corresponding to positive or negative digital inputs. Referring to the lower portion of FIG. 1A, such a capability can be provided by coupling the output of the amplifier 46 to an inverting amplifier 80, and by employing a selector switch 82 having two sections 82A, 82B to select either the direct output or the inverted output. The switch 82 is operated by a conventional switch driver 84 controlled by an input lead 86 to which is directed a sign bit, i.e. a binary bit indicating whether the number to be converted is positive or negative. The sign bit is gated by a strobe circuit (not shown) synchronized with the converter strobe. When so gated, the drive 84 opens either switch section 82A or switch section 82B, but not both at the same time. The selected analog signal is coupled to an output amplifier 88 which provides the final analog output signal of the converter.

Since it is not readily possible to assure exact synchronism between the operation of the switch 82 and the strobing of the storage register 10, transient errors may be developed in the converter output during the transition between negative and positive outputs. The problem cannot be solved simply by arranging the circuit so that the sign switch 82 is always actuated slightly before or slightly after strobing of the storage register, because a momentary error effect such as an overshoot can result under either circumstance, depending upon the beginning and ending voltages of the analog output. In accordance with a further aspect of the present invention, this problem has been solved by a special arrangement for insuring that the analog output signal, whenever a sign change is to be made, will first be brought to zero potential. Since every sign change requires the analog voltage to pass through zero, automatically shifting the voltage to zero whenever a sign change is to take place insures that the output will not vary in the wrong direction at the outset of a change. Holding the output on zero until all of the switching has been completed prevents overshooting of the final voltage.

In more detail, the converter includes (referring now to the upper left-hand corner of FIG. 1A) a sign change detector 90 which in the present embodiment includes a conventional flip-flop 92 arranged to receive the sign bit as the controlling input. The set and reset outputs of this flip-flop are coupled through respective derivative circuits 96, 98 and isolating diodes 100, 102 to a common load resistor 104. Thus, whenever there is a change of sign (where the sign bit changes from "zero" to "one" or vice-versa), a sharp positive spike will be developed at the load resistor 104. This spike momentarily turns on a transistor switch 106 which, in turn, momentarily disables a transistor 108 serving to establish the bias voltage for the power supply lead 26.

Power supply lead 26 thereupon goes negative and holds the buffer transistors 22 "on", producing a flow of current through all of the resistors 36 for a brief period. This current flow causes all of the switching transistors 34 to be turned off momentarily, thereby making the output voltage of amplifiers 46 and 80 to be held momentarily at zero. Thus, even though the sign-change switch 82 is not exactly synchronized with the gating of the register 10, the converter output will momentarily be shifted to zero during a sign change.

After the spike has subsided at the input to transistor 106, the buffer transistors 22 are all returned to normal operating conditions, and the strobed control pulses fed to these transistors from register 10 will activate the switching transistors 34 in a pattern representing the stored digital number. Thus, the output of the amplifier 88 will be shifted to the proper level, and transient errors during the sign change transition avoided.

Another source of error is changes in ambient temperature, which alter the operating characteristics of the switching transistors 34, and tend to vary the magnitude of current produced thereby. In accordance with a still further aspect of the invention, means are provided to minimize such effects of ambient temperature. More specifically, all of the bases 110 (110A, etc.) of the switching transistors 34 are connected to a bias lead 112 the voltage of which is regulated so as to maintain the current through the switching transistors substantially constant with changes in temperature.

The voltage of the bias lead 112 is primarily determined by a transistor 114 in series with a resistor 116. Bias lead 112 also is connected to the base 120 of a control transistor 122 matched to the first switching transistor 34A, particularly in having a "beta" which tracks the corresponding parameter of transistor 34A with changes in temperature. The emitter 124 of control transistor 122 is connected through a load resistor 126 to the power supply lead 38, and the collector 128 of this transistor is connected through a resistive network 130 to a positive reference voltage terminal 132. The circuit elements are so selected so as to produce a predetermined flow of current through the resistive network 130 and the control transistor 122, and resulting in a zero potential at a control point 134 between the resistive network 130 and the control transistor. The magnitude of the current through transistor 122 is set to equal the flow of current through the switching transistor 34A when the latter has been turned on.

If there is a change in ambient temperature, the result typically will be a change in operating characteristics of the switching transistor 34A, so as to alter the normal current flow therethrough. By positioning the control transistor 122 physically adjacent the switching transistor 34A, the same temperature effect will be experienced by the control transistor. The change of current produced by a change in temperature is detected by an operational amplifier 136 having one input terminal connected to control point 134, and its other input terminal connected through a resistor 138 to ground. The output of this amplifier 136 is connected through a resistor 140 and an isolating diode 142 to power supply lead 38.

When there is a change in the current supplied to the amplifier 136 from control point 134, there will be a corresponding change in the amount of current drawn by this amplifier from the power supply lead 38. Since this power supply lead is connected through a resistor 150 to the power supply terminal 152, the change in current drawn by amplifier 134 will cause a corresponding change in the voltage of power supply lead 38. Thus, the amplifier 134 provides an amplified negative feedback action which automatically alters the voltage of lead 38 in such a way as to maintain constant the current flow through the control transistor 122. Since transistor 122 is matched to switching transistor 34A, the change in potential of power supply lead 38 will have a similar effect on the functioning of this switching transistor, i.e. it will compensate for the change in ambient temperature of transistor 34A, and assure that the current through that transistor is maintained effectively invariant with changes in temperature. Moreover, this result can be achieved with a power supply 152 of relatively modest complexity and cost, because the power supply need not be closely regulated internally.

The same controlling influence tends to maintain constant the current through the other switching transistors 34B, etc. However, as a practical matter these latter transistors need not be so identically matched in characteristics to the first transistor 34A, because they represent binary information of progressively less significance to the ultimate analog output voltage.

Typical values and types of elements used in a preferred embodiment of the invention as described above are as follows:

| | |
|---|---|
| Diodes | 1N4149 |
| Buffer transistors 22 | 2N4250 |
| Switching transistors 34 | SE4010 |
| Operational amplifiers | MC1539G |
| Resistors 28A–28H | 12.7K |
| Resistor 28I | 25.5K |
| Resistor 28J | 51.1K |
| Resistor 28K | 100K |
| Resistor 28L | 200K |
| Resistor 28M | 390K |
| Resistors 36A–36H | 50K |
| Resistor 36I | 100K |
| Resistor 36J | 200K |
| Resistor 36K | 400K |
| Resistor 36L | 800K |
| Resistor 36M | 1.6M |
| Current divider 48 | 2.5K and 2.5K |
| Current divider 50 | 5K and 1.666K |
| Current divider 52 | 3.5K and 1K |
| Series resistor 74 | 500 |
| Shunt resistor 76 | 1K |
| Resistor 77 | 500 |

It will be apparent from the foregoing description that various changes can be made to the preferred embodiment without departing from the spirit of the invention. For example, the values of elements herein disclosed should not be construed as limiting. Other changes suited for particular applications will be apparent to those skilled in this art.

I claim:

1. In a digital-to-analog converter, the combination of:

a plurality of switching transistors activatable in a selected pattern corresponding to a digital input signal;

output circuit means coupled to said switching transistors to combine the currents contributed by any activated switching transistors;

means for setting the currents contributed individually by the switching transistors in accordance with a digital-to-analog weighting pattern;

a power supply for producing a supply voltage for energizing said switching transistors;

a reference transistor connected to said power supply to produce a flow of current through said reference transistor proportional to said power supply voltage; and sensing means responsive to the magnitude of said current flow through said reference transistor, said sensing means including means operable to adjust said supply voltage to tend to maintain said current through said reference transistor constant, the adjustments to said power supply voltage serving to tend to maintain the currents through said switching transistors constant in the face of changing transistor characteristics due to temperature variations and the like.

2. Apparatus as claimed in claim 1, wherein at least certain of said switching transistors have output currents providing equal current densities within those transistors.

3. Apparatus as claimed in claim 1, wherein said reference transistor is matched to at least one of said switching transistors.

4. In a digital-to-analog converter of the type including a plurality of individually-activatable switching transistors each having a collector, an emitter and a base, said transistors being arranged to produce output currents for summing at an output junction;

a plurality of resistors each connected between a common line and the emitter of a respective switching transistor;

power supply means having an output connected to said switching transistors to apply a supply voltage between the base of each transistor and said common line, thereby to control the emitter currents in accordance with the magnitude of the supply voltage and the ohmic resistance of the associated resistor;

a reference transistor having a collector, an emitter and a base;

a reference resistor connected at one end to the emitter of said reference transistor;

circuit means connecting said power supply means output to said reference transistor to apply between the base of said reference transistor and the other end of said reference resistor to a reference voltage proportional to said supply voltage;

sensing means responsive to current flow through said reference transistor; and voltage varying means under the control of said sensing means, said voltage varying means including means for adjusting the output of said power supply means so as to tend to maintain the current through said reference transistor constant, thereby to correspondingly adjust the supply voltage of said switching transistors to tend to maintain the currents thereof constant.

5. Apparatus in claim 4, wherein said reference voltage and said supply voltage are equal;

said other end of said reference resistor being connected to said common line.

6. Apparatus as in claim 5, wherein the bases of all of said transistors are connected together to a second common line;

said voltage varying means serving to control the voltage difference between said first and second common lines.

7. Apparatus as in claim 4, wherein the collector currents of said switching transistors are directed to said output junction;

said sensing means being responsive to the collector current of said reference transistor.

8. Apparatus as in claim 7, wherein said sensing means includes means to compare the reference transistor collector current with a reference current of fixed magnitude.

9. Apparatus as in claim 8, wherein said voltage varying means comprises an operational amplifier the output of which controls the voltage applied between the base of said reference transistor and said other end of said reference resistor.

10. For use in signal-processing apparatus, such as a digital-to-analog converter, incorporating switchable current source means comprising a transistor having a collector, an emitter, and a base, and wherein the magnitude of current flow produced by such source is set by a resistor connected at one end to said emitter to carry the emitter current of such transistor, there being DC power supply means having a pair of output terminals connected respectively to the base of such transistor and to the remote end of said resistor to maintain a DC voltage differential therebetween, whereby to produce from the collector of such transistor an output current which is relatively unaffected by changes in load at the output of the current source;

that improvement for maintaining the output current of such current source constant in the face of changes in operating characteristics of such current-source transistor, comprising:

a reference transistor having a collector, an emitter and a base, said reference transistor being located adjacent said current source transistor and matched thereto;

a reference resistor connected at one end to the emitter of said reference transistor;

circuit means connecting said power supply means output terminals respectively to the base of said reference transistor and to the remote end of said reference resistor;

sensing means responsive to changes in magnitude of the collector current of said reference transistor; and feedback voltage adjustment means under the control of said sensing means for automatically altering the DC voltage produced at said DC power supply output terminals as required to maintain constant the collector current from said reference transistor, thereby serving to continuously adjust the DC voltage applied to said current source transistor so as to maintain constant the collector current thereof in the face of changes in operating characteristics of the current-source transistor.

11. Apparatus as claimed in claim 10, wherein said voltage adjustment means comprises an operational amplifier having its output serving as one of said power supply output terminals.

12. Apparatus as claimed in claim 11, including a source of reference current connected to the input of said operational amplifier in opposition to said collector current of said reference transistor, said operational amplifier continuously comparing said reference current with the collector current of said reference transistor and automatically adjusting its ouput voltage to maintain those two currents equal.

13. In a digital-to-analog converter and the like, comprising individually-activatable switching transistors each having a collector, an emitter and a base, said transistors being arranged to produce output currents for summing at an output junction;

a plurality of resistors each connected between a first common line and the emitter of a respective switching transistor;

a second common line connected to the bases of said switching transistors;

a reference transistor having a collector, an emitter and a base;

a reference resistor connected between the emitter of said reference transistor and said first common line;

means connecting the base of said reference transistor to said second common line;

an operational amplifier having its output connected to one of said common lines to control the potential thereof relative to the other of said common lines;

first circuit means connecting the collector of said reference transistor to the input of said operational amplifier to supply to said input a first current corresponding to the collector current to the reference transistor; and second circuit means connected to the input of said operational amplifier to supply to said input a second current of fixed magnitude opposing said first current, said operational amplifier automatically adjusting the potential difference between said first and second common lines to maintain said first current equal to said second current, maintaining the collector current of said reference transistor constant, and thereby holding the collector currents of said switching transistors constant.

14. For use in a signal-processing apparatus, such as a digital-to-analog converter, incorporating constant current generator means comprising a transistor current source having a collector, an emitter, and a base, and wherein the magnitude of current flow produced by such source is set by a circuit connected between the base and the emitter and including a resistor and a DC power supply means, said resistor and the DC voltage of said power supply means being connected in series between said base and said emitter, whereby to produce from the collector of said current source transistor an output current which is relatively unaffected by changes in load at the output of the current source;

that improvement for maintaining the output current of such current source constant in the face of changes in operating characteristics of such current-source transistor, comprising:

a reference transistor having a collector, an emitter and a base, said reference transistor being located adjacent said current source transistor and matched thereto;

a reference resistor;

circuit means connecting the DC voltage of said power supply means and said reference resistor in series between the base and the emitter of said reference transistor;

sensing means responsive to changes in magnitude of the current passing through said reference transistor; and feedback voltage adjustment means under the control of said sensing means for automatically altering the DC voltage produced by said DC power means as required to maintain constant the sensed current passing through said reference transistor, thereby serving to continuously adjust the DC voltage applied to said current source transistor so as to maintain constant the current passing therethrough in the face of changes in operating characteristics of the current source transistor.

* * * * *

UNITED STATES PATENT OFFICE
CERTIFICATE OF CORRECTION

Patent No. 3,803,590 Dated April 9, 1974

Inventor(s) James J. Pastoriza

It is certified that error appears in the above-identified patent and that said Letters Patent are hereby corrected as shown below:

On the cover sheet insert -- The portion of the term of the patent subsequent to August 15, 1989 has been disclaimed --.

Signed and sealed this 19th day of November 1974.

(SEAL)
Attest:

McCOY M. GIBSON JR.
Attesting Officer

C. MARSHALL DANN
Commissioner of Patents